United States Patent
Park

(10) Patent No.: US 6,706,617 B2
(45) Date of Patent: Mar. 16, 2004

(54) METHOD FOR FORMING ISOLATION PATTERN IN SEMICONDUCTOR DEVICE

(75) Inventor: Jong Woon Park, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/317,929

(22) Filed: Dec. 12, 2002

(65) Prior Publication Data

US 2003/0176044 A1 Sep. 18, 2003

(30) Foreign Application Priority Data

Mar. 13, 2002 (KR) .................................. 2002-13629

(51) Int. Cl.⁷ .............................................. H01L 21/76
(52) U.S. Cl. ..................................................... 438/453
(58) Field of Search .............................. 438/453, 439, 438/294

(56) References Cited

U.S. PATENT DOCUMENTS

| | | | |
|---|---|---|---|
| 5,811,863 A | 9/1998 | Rostoker et al. | 257/401 |
| 5,973,376 A | 10/1999 | Rostoker et al. | 257/401 |
| 6,020,092 A | * 2/2000 | Sakoh | 430/5 |
| 6,097,073 A | 8/2000 | Rostoker et al. | 257/401 |
| 6,212,980 B1 | 4/2001 | Kratch et al. | 81/434 |

FOREIGN PATENT DOCUMENTS

JP     252465     2/1990

* cited by examiner

Primary Examiner—David Nelms
Assistant Examiner—Quoc Hoang
(74) Attorney, Agent, or Firm—Ladas & Parry

(57) ABSTRACT

A method enables a hole-type LPC mask to be employed instead of the conventional T-type LPC mask, thereby reducing time and manpower for the manufacture of the mask. The method comprises the steps of: arranging a plurality of bit lines at regular intervals in a longitudinal direction on a semiconductor substrate; arranging a plurality of gate lines at regular intervals in a transverse direction while intersecting the bit lines; forming isolation patterns on a semiconductor substrate, each of the isolation patterns having wing-like branches in a bent shape, each of the bit lines extending over and overlapping on central portions of the isolation patterns, each of the gate lines being in contact with side end portions of the isolation patterns; and forming first contact holes through the wing-like branches of each of the isolation patterns and forming a second contact hole through the central portion of each of the isolation patterns between the wing-like branches.

11 Claims, 1 Drawing Sheet

METHOD FOR FORMING ISOLATION PATTERN IN SEMICONDUCTOR DEVICE

BACKGROUND OF THE INVENTION

1. Field of the Invention

The present invention relates to a method for forming an isolation pattern in a semiconductor device, and more particularly to a method for forming an isolation pattern in a semiconductor device, which enables a hole-type LPC mask to be employed.

2. Description of the Prior Art

Nowadays, Bluechip devices with a size of 0.16 µm or less employ isolation (ISO) patterns each having a shape of the letter "I", that is a linear shape.

In fabricating a Bluechip device, after the linear-shaped isolation patterns are formed, LPC (Landed Plug Contact) patterns are formed in a shape of letter "T" as shown in FIG. 1, so as to allow the isolation patterns to be connected to bit lines and short-circuiting between a gate layer and a bit line layer.

In a semiconductor device having the conventional T-shaped LPC patterns as described above, as shown in FIG. 1, a plurality of bit lines 13 are arranged at regular intervals in a longitudinal direction, and a plurality of gate lines 11 are arranged at regular intervals in a transverse direction while intersecting the bit lines 13, on a semiconductor substrate (not shown).

Further, on the semiconductor substrate (not shown), isolation patterns 15 are aligned in a linear form. In this case, the gate lines 11 extend in the vertical direction while crossing over both ends of each of the isolation patterns 15 aligned in a linear shape.

Also, a T-shaped LPC pattern 17 is formed on each of the isolation patterns 15, and the bit lines 13 extend in the longitudinal direction while crossing over central portions of the LPC patterns 17.

However, in the conventional method, not only too many times of try and error for simulation but also much time and manpower are necessary, in order to manufacture a perfect mask for the formation of the T-shaped LPC pattern as described above.

Further, the mask has a complicated pattern, which may easily cause errors in the mask. For example, from among various Bluechip devices, the LPC mask shows the worst CD uniformity.

SUMMARY OF THE INVENTION

Accordingly, the present invention has been made to solve the above-mentioned problems occurring in the prior art, and an object of the present invention is to provide a method for forming an isolation pattern in a semiconductor device, which enables a hole-type LPC mask to be employed instead of the conventional T-type LPC mask, thereby reducing time and manpower for the manufacture of the mask, since the hole-type LPC mask can be manufactured more easily than the conventional T-type LPC mask.

In order to accomplish this object, there is provided a method for forming an isolation pattern in a semiconductor device, the method comprising the steps of: arranging a plurality of bit lines at regular intervals in a longitudinal direction on a semiconductor substrate; arranging a plurality of gate lines at regular intervals in a transverse direction while intersecting the bit lines; forming isolation patterns on a semiconductor substrate, each of the isolation patterns having wing-like branches in a bent shape, each of the bit lines extending over and overlapping on central portions of the isolation patterns, each of the gate lines being in contact with side end portions of the isolation patterns; and forming first contact holes through the wing-like branches of each of the isolation patterns and forming a second contact hole through the central portion of each of the isolation patterns between the wing-like branches.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
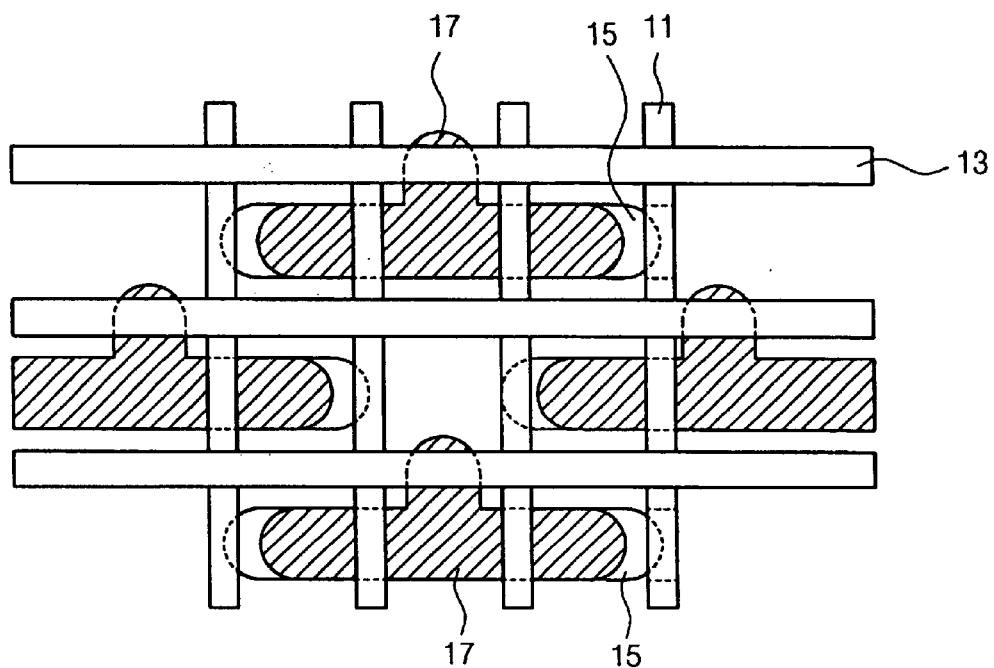
FIG. 1 shows a layout of isolation patterns formed in a semiconductor device by a conventional method.
Figure 2:
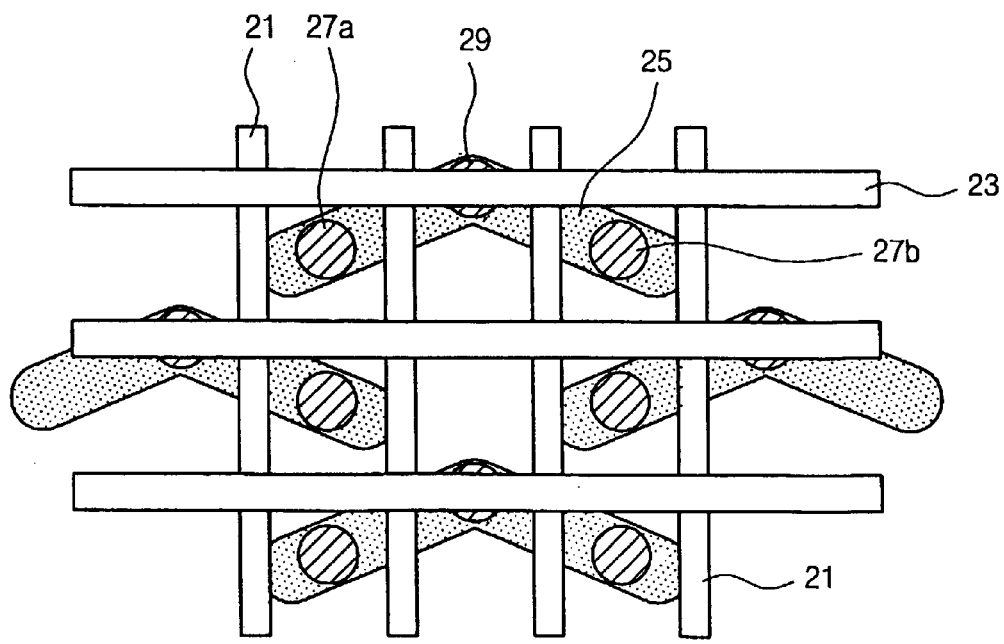
FIG. 2 shows a layout of isolation patterns formed in a semiconductor device by a method according to the present invention.

FIG. 2 shows the layout of isolation patterns, which are formed in a semiconductor device by a method according to the present invention.

In the method for forming an isolation pattern in a semiconductor device according to the present invention, as shown in FIG. 2, a plurality of bit lines 23 are arranged at regular intervals in a longitudinal direction, and a plurality of gate lines 21 are arranged at regular intervals in a transverse direction while intersecting the bit lines 23, on a semiconductor substrate (not shown).

Further, isolation patterns 25 each having a shape of the letter "V" are formed on the semiconductor substrate (not shown). In this case, the gate lines 21 extend over ends of both wing-like branches of each isolation pattern 25, and first contact holes 27a and 27b for connection with storage node contacts (not shown) are formed through central portions of the wing-like branches of each isolation pattern 25.

Further, a second contact hole 29 is formed through a central portion between the wing-like branches of each isolation pattern 25.

As a result, a hole-type LPC consisting of three contact holes 27a, 27b, and 29 is formed on each isolation pattern 25.

In manufacturing the V-shaped isolation patterns 25 as described above, a photoresist film (not shown) is applied on a semiconductor substrate (not shown) and is then subjected to an exposure and development processes by photolithography, so that the photoresist film is selectively eliminated to form V-shaped photoresist patterns (not shown). In this case, an exposer used in the exposure process may employ lights of all wavelength bands, including G-line beams, I-line beams, KrF beams, ArF beams, $F_2$ beams, EUV beams, X-rays, and E-beams.

Further, the photoresist film may employ a proper kind of photoresist according to the use of the photoresist, for example, photoresist for I-line beams, photoresist for KrF beams, photoresist for ArF beams, photoresist for $F_2$ beams, photoresist for E-beams, and photoresist for X-rays.

Further, an oxide film, a polysilicon layer, nitride film, an organic BARC layer, an inorganic BARC layer, a Ti layer, a TiN layer, an Al layer, or a W layer may be used as a base layer under the photoresist film in the patterning process.

Meanwhile, the patterning process utilizing the photoresist film is performed for a semiconductor substrate with or without a performance of CMP. In this case, the lines have a pitch of 0.1 to 100 μm and a size of 0.05 to 100.0 μm.

A method for forming an isolation pattern in a semiconductor device according to the present invention as described above has the following effects.

In the method for forming an isolation pattern in a semiconductor device according to the present invention, each of the isolation patterns employed in Bluechip devices has a bent shape or a V shape instead of a linear shape, so as to enable formation of hole type LPC which can be used in various devices. Therefore, time and manpower required in manufacturing the conventional T-type LPC mask can be saved in the method according to the present invention.

Further, in a photo line formation step in the conventional method, a so-called collapse phenomenon may happen in which a pattern collapses when the height of the line reaches 3.5 times of the width of the line due to the influence of an aspect ratio (photoresist thickness) of the line itself and its relation to the CD value formed in the development process after the exposure. In the method according to the present invention, since the isolation pattern has a bent shape although it has a relatively small width, the isolation pattern can maintain the present thickness of the photoresist film and is prevented from collapsing even when it has a smaller width.

Therefore, the method according to the present invention can overcome various problems of the conventional linear-shaped isolation patterns, such as etching-related problems (influences on the etching profile), which may caused due to the small photoresist thickness in order to prevent the collapse in the patterning process.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming an isolation pattern in a semiconductor device, the method comprising the steps of:

arranging a plurality of bit lines at regular intervals in a longitudinal direction on a semiconductor substrate;

arranging a plurality of gate lines at regular intervals in a transverse direction while intersecting the bit lines;

forming isolation patterns on a semiconductor substrate, each of the isolation patterns having wing-like branches in a bent shape, each of the bit lines extending over and overlapping on central portions of the isolation patterns, each of the gate lines being in contact with side end portions of the isolation patterns; and forming first contact holes through the wing-like branches of each of the isolation patterns and forming a second contact hole through the central portion of each of the isolation patterns between the wing-like branches.

2. A method for forming an isolation pattern in a semiconductor device as claimed in claim 1, wherein the first contact holes connects the isolation patterns with storage node contacts.

3. A method for forming an isolation pattern in a semiconductor device as claimed in claim 1, wherein each of the first contact holes is formed through a portion of each of the isolation patterns, which is disposed between the gate lines and the bit lines.

4. A method for forming an isolation pattern in a semiconductor device as claimed in claim 1, wherein the second contact holes are connected with the bit lines.

5. A method for forming an isolation pattern in a semiconductor device as claimed in claim 1, wherein the isolation patterns, each having the bent shape, are formed through exposure and development processes utilizing a photoresist film.

6. A method for forming an isolation pattern in a semiconductor device as claimed in claim 1, wherein an exposer used in the exposure process employs lights of all wavelength bands, including G-line beams, I-line beams, KrF beams, ArF beams, $F_2$ beams, EUV beams, X-rays, and E-beams.

7. A method for forming an isolation pattern in a semiconductor device as claimed in claim 1, wherein the photoresist film employs a predetermined kind of photoresist according to the use of the photoresist, such as photoresist for I-line beams, photoresist for KrF beams, photoresist for ArF beams, photoresist for $F_2$ beams, photoresist for E-beams, and photoresist for X-rays.

8. A method for forming an isolation pattern in a semiconductor device as claimed in claim 1, wherein an oxide film, a polysilicon layer, nitride film, an organic BARC layer, an inorganic BARC layer, a Ti layer, a TiN layer, an Al layer, or a W layer may be used as a base layer under the photoresist film in the patterning process.

9. A method for forming an isolation pattern in a semiconductor device as claimed in claim 1, wherein the gate lines and the bit lines have a pitch of 0.1 to 100 μm and a size of 0.05 to 50.0 μm.

10. A method for forming an isolation pattern in a semiconductor device as claimed in claim 1, wherein each of the first and second contact hole has a size of 0.1 to 100.0 μm.

11. A method for forming an isolation pattern in a semiconductor device as claimed in claim 1, wherein each of the isolation patterns has a shape of a letter "V".

* * * * *